United States Patent [19]

Meisner et al.

[11] 4,282,513
[45] Aug. 4, 1981

[54] PROCESS AND ARRANGEMENT FOR THE ELECTRONIC CONTROL OF THE INPUT PULSES OF A MANUALLY ROTATABLE PULSE GENERATOR INTO AN ELECTRONIC COUNTER

[75] Inventors: Alfred Meisner, Nuremberg; Hans Grasser, Ekcental; Peter Glasmacher, Munich, all of Fed. Rep. of Germany

[73] Assignee: Diehl GmbH & Co., Fed. Rep. of Germany

[21] Appl. No.: 82,165

[22] Filed: Oct. 5, 1979

[30] Foreign Application Priority Data

Oct. 5, 1978 [DE] Fed. Rep. of Germany ....... 2843353

[51] Int. Cl.³ .......................... G04C 3/00; H04Q 9/00
[52] U.S. Cl. .............................. 340/149 R; 340/309.1; 368/185
[58] Field of Search ..................... 340/149 R, 309.1; 58/85.5; 368/185

[56] References Cited

U.S. PATENT DOCUMENTS 4,176,515  12/1979  Stein ...................................... 58/85.5

Primary Examiner—Harold I. Pitts
Attorney, Agent, or Firm—Scully, Scott, Murphy & Presser

[57] ABSTRACT

A process and an arrangement for the electronic interruption and the cancellations of the interruption of input pulses of a manually rotatable pulse generator in an electronic storage for the purpose of locking the storage condition, including a pulse generator, a first and a second counter, a comparator which is influenced by the two counters, as well as an input key. At the coincidence of the two counter contents, the pulse flow from one impulse-generating element should be so interrupted that the content will be unchanged and also remain constant even when further counting pulses are generated by the input arrangement.

4 Claims, 4 Drawing Figures

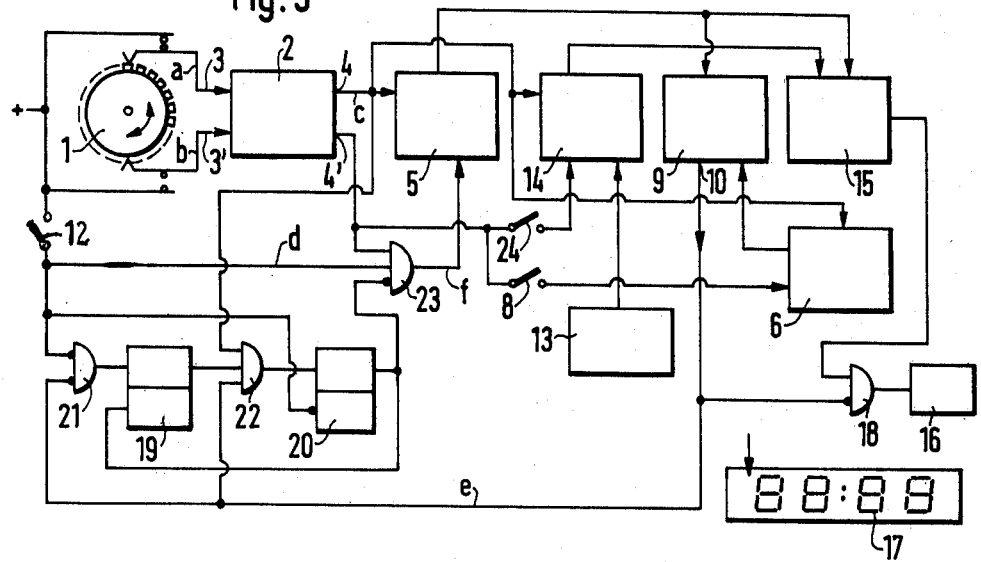
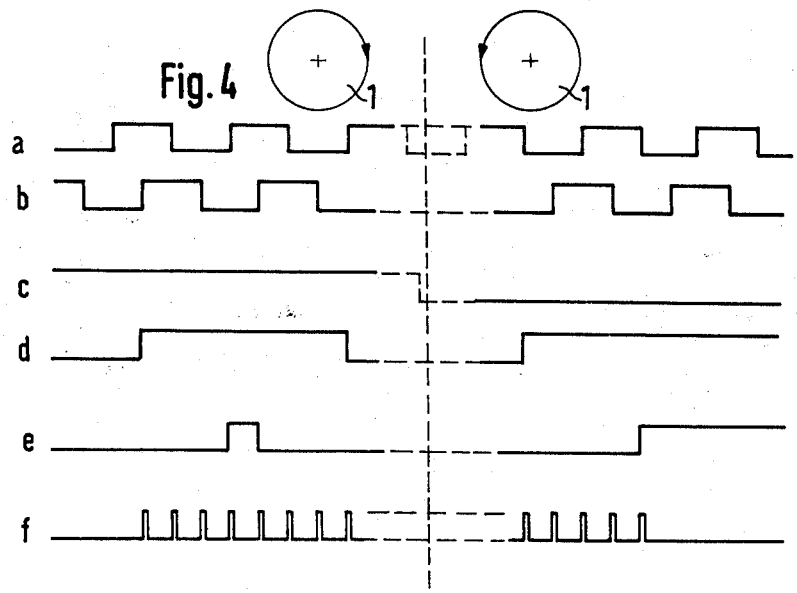

PROCESS AND ARRANGEMENT FOR THE ELECTRONIC CONTROL OF THE INPUT PULSES OF A MANUALLY ROTATABLE PULSE GENERATOR INTO AN ELECTRONIC COUNTER

BACKGROUND OF THE INVENTION

1. Field of the Invention

The present invention relates to a process and to an arrangement for the effectuation of this process for the electronic interruption and the cancellations of the interruption of input pulses of a manually rotatable pulse generator in an electronic counter for the purpose of locking the counter condition, including an impulse generator, a first and second counter, a comparator which is influenced by the two counters, as well as an input key.

2. Discussion of the Prior Art

Arrangements of this type are already presently known. In the field of timepieces and calculators, the contents of two counters or memories are frequently positioned opposite each other through a comparator and, under predetermined conditions, for example, equality of the counter contents, there is triggered a predetermined function, in effect, there is carried out an operation.

For example, an arrangement of that type is described in German Patent Specification No. 21 17 756 in which there are compared the contents of two counters of a time clock and at the equality of which there is then triggered an alarm.

Also known, for instance, is the triggering or continuation of a predetermined calculating sequence at the equality of two numbers which can be stored in different counters.

SUMMARY OF THE INVENTION

Accordingly it is an object of the present invention to provide a process and arrangement for electronically locking the content of a counter when the content thereof coincides with that of a second counter. At the coincidence of the two counter contents, the pulse flow from one pulse-generating element should be so interrupted that the content will be unchanged and also remain constant even when further counting pulses are generated by the input arrangement.

Furthermore, there should be produced such an arrangement which facilitates the extinguishing of one timing in one counter with the input element of the timing counter which, for example, is constructed as a rotatable pulse generator.

The foregoing object is inventively achieved by a process for the electronic interruption and cancellations of the interruption of input pulses of a manually rotatable pulse generator in an electronic storage for the purpose of locking the storage condition through the following process steps:

(a) the pulses of the pulse generator are fed into an electronic circuit arrangement, particularly a microprocessor;

(b) the direction of rotation of the pulse generator axis is recognized from the emitted pulses of the pulse generator, and activates the input of a counter constructed as a forward-backward counter and which corresponds to this direction of rotation of this circuit arrangement;

(c) the condition of this counter is compared with a preset content of a further counter of this circuit arrangement;

(d) the pulses, upon actuation of the pulse generator and of the input switch coacting with the electronic circuit arrangement, are read for so long into the counter until at the coincidence of the counter condition with the preset condition of the other counter there is locked the content of the counter in that there is interrupted the further infeed of pulses from the pulse generator into the counter;

(e) the interruption of the input pulses into the counter which constructed as the forward-backward counter is then again cancelled when at the coincidence of the condition of the counters with the preset content of the other counter, the input switch is in the interim opened.

The invention further contemplates an arrangement for the effectuation of the above-mentioned process which includes an pulse generator, an evaluating logic circuit for the direction of rotation of the pulse generator, a first and second counter, a comparator which is influenced by the two counters, as well as an input key, and wherein a control circuit is connected to the output of the comparator, the control circuit being connected intermediate the pulse output of the evaluating logic circuit recognizing the direction of rotation and the input of the first counter.

A more specific object of the present invention is to have the letter specifically adapted for use in connection with a time clock or horological instrument.

BRIEF DESCRIPTION OF THE DRAWINGS

Reference may now be had to the following detailed description of preferred embodiments of the invention, taken in conjunction with the accompanying drawings; in which:

FIG. 3 is a schematic block diagram of a time clock with a digitally contructed control circuit; and FIG. 4 is an pulse-time graph illustrating important switching points.

DETAILED DESCRIPTION

Figure 1:
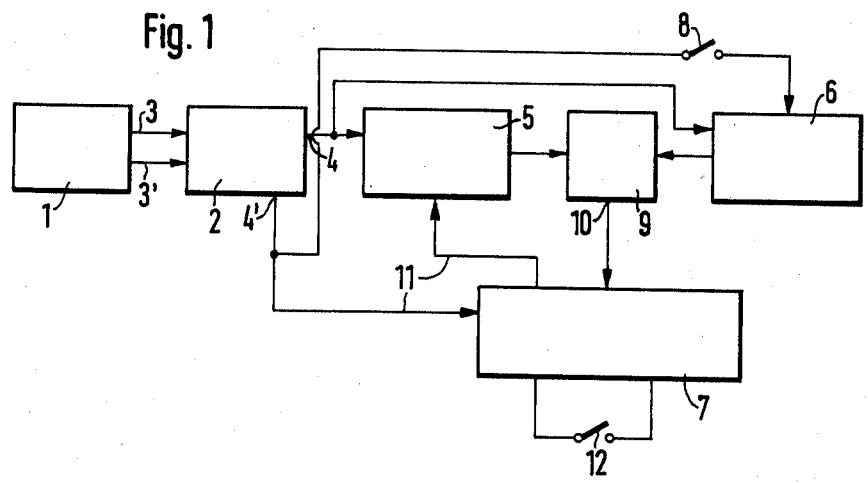
FIG. 1 is a schematic block diagram of an arrangement for the interruption and the cancellation thereof of pulses in a storage.

FIG. 1 illustrates an pulse generator 1, an evaluating or gating logic circuit 2, a first memory counter 5 and a second memory counter 6, a comparator 9, a control circuit 7, a key 8 for the input of pulses from the pulse generator 1 into the counter 6, as well as a second key 12 which is in operative connection with the control logic circuit 7. Identified by reference numerals 3 and 3[1] are the outputs of the pulse generator and by y and 4[1] the outputs of the evaluating logic circuit. The conductor 11 connects the evaluating logic circuit with the control circuit and with the first memory counter.

The paired pulses which are generated by the pulse generator 1 are introduced through the outputs of 3, 3[1] thereof into the gating logic circuit 2 connected to the outputs of the pulse generator. This evaluating logic circuit recognizes from the relative phase position of the pulse pairs the direction of rotation of the pulse generator axis and, in accordance with the direction of rotation, prepares the forward or the backward count input of the memory counter 5. (Refer also to the pulse plot lines in FIG. 4a, b.) This preactivation of the memory counter 5 is carried out through the output 4 of the evaluating logic circuit 2 through which, in accordance with the direction of rotation of the pulse generator axis, the signals logic "0" (for example, backward counting) or logic "1" (for example, forward counting) are conducted further to the memory counter 5 (see also FIG. 4, plot line c). Through the second output $4^1$ of this evaluating logic circuit, count pulses are, on the one hand, conducted further along to the memory counter 6 which connected to the output thereof across a key 8 and, on the other hand, the output $4^1$ is connected with the input of the control circuit 7. Upon the actuation of the key 8 and the pulse generator 1, pulses are counted into the memory counter 6 and the counter condition is changed in accordance with the direction of rotation of the pulse generator 1.

In order to be able to vary the storage condition of the memory counter 5, there must be actuated the pulse generator 1 and the key 12. With this prerequisite, pulses are conducted through the pulse conductor 11 to the memory counter 5 for so long, until the comparator 9 recognizes the equality or identity of the contents of the memory counters 5 and 6, and through an output 10 thereof causes the control circuit 7 to interrupt the pulse flow to the memory counter 5. This memory counter 5 is thus electronically locked, its contents will also not be changed even when, upon occasion, the pulse generator 1 and the key 12 may be actuated beyond the instant of the locking. The memory counter 5 is again unlocked only at the release of the key 12. When this key is again depressed and thereby there is actuated the pulse generator 1, then the electronic locking is extinguished and the condition of the memory counter 5 can be changed from the position at which it coincides with the condition of the memory counter 6.

An arrangement of that type can be utilized, for example, when it is desired to limit a digitalized regulating standard, which is introduced with a rotatable pulse generator into a control system, to a preadjustable range. For instance, the electronic locking can take place at a still permissible maximum value for the regulating standard or magnitude.

Figure 2:
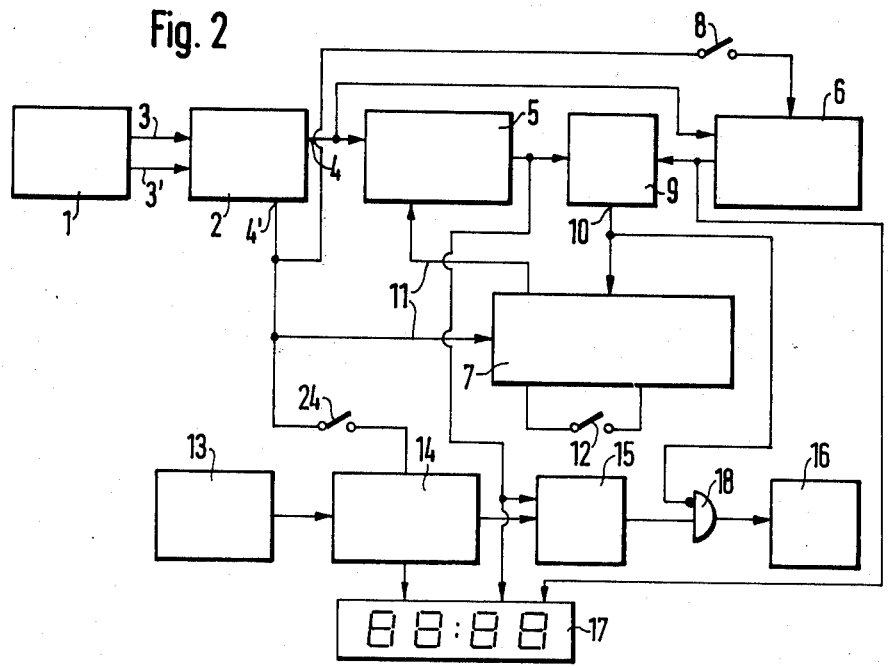
FIG. 2 is a schematic block diagram of a time clock equipped with the inventive arrangement.

A further advantageous application of such a locking circuit is illustrated in FIG. 2 of the drawings.

Illustrated therein, in addition to the pulse generator 1, the evaluating logic circuit 2, memory storages 5 and 6, the comparator 9, the control circuit 7, as well as keys 8 and 12, are further operational blocks. These include a frequency generator with divider steps 13, a counter 14, a comparator 15, an alarm emitter 16, a digital display 17, an AND gate 18, as well as a key 24. These components form a time clock in which the extinguishing of a point in time which is stored in memory counter 5 contemplated to be a timing counter, is carried out by means of the input element which is constructed as a rotatable pulse generator. "Extinguished" is a time when the stored content of the timing memory counter 5 is electronically locked at a preselectable position, for example 00:00 hour and, concurrently, an alarm emitter 16 is placed out of operation by the comparator 9 through an AND gate 18 connected ahead of the former.

The operation of the components 1–12 corresponds the operation of those described in connection with FIG. 1 of the drawings.

The frequency transmitter 13 with a divider step connected to the output thereof drives the counter 14.

The comparator 15 tests the contents of the timing memory counter 5 and of the counter for any coincidence.

The alarm emitter 16 comes into operation when the contents of the timing memory counter 5 and the counter 14 are equal, except when the timing counter 5 is found to be in its locked position. The set time can be extinguished in that, by means of the input elements 1, the stored condition of the timing memory counter 5 is brought into a preselectable locked position. In this instance, a signal appears at the ouput 10 of the comparator 9 which blocks the AND gate 18 connected ahead of the input of the alarm emitter 16.

Representable on the digital time display (17) are the contents of all of the counters, meaning the running time (counter 14), the timing period (counter 5) as well as the "locking time" (counter 6).

Should a new time period be set after a switching off, when only the timing keys 12, i.e. the locking sequence is inoperative at the opening of this switch, and the pulse transmitter 1 need be actuated.

In FIG. 3 the above-mentioned time clock is again schematically illustrated, however, the control circuit is illustrated in a possible digital embodiment.

The foregoing consists essentially of two flip-flops 19, 20, each with an AND gate 21, 22 connected ahead thereof, as well as a further AND gate 23.

When the input key is opened and the stored contents of memory counters 5 and 6 do not coincide (logic "0" at output 10 of the comparator 9), then the flip-flop 19 is set by the first AND gate 21. The output of this flip-flop supplies power to one of the three inputs of the second AND gate 22 which is connected ahead of the second flip-flop 20. The second input of the AND gate is supplied with power from the output of the comparator 9, the third input is connected with the output 4 of the evaluating logic circuit 2 which, in accordance with the direction of rotation of the pulse generator axis, activates either the forward or the backward input of the timing memory counter 5. Only at one of the two possible directions, for example, in the forward direction of rotation, is there present at this output the logic "1", in the other instance, the logic "0".

From the foregoing it can be ascertained that the two flip-flops 20 can be set at only the following conditions:

a. Flip-flop 19 when the switch 12 is not closed and the contents of counters 5 and 6 do not coincide.

b. Flip-flop 20 when flip-flop 19 is set, the pulse generator is rotated backwards, and the contents of counters 5 and 6 coincide.

The output of the flip-flop 20 supplies current to a negative input of the AND gate 23 which allows the count pulses present at the pulse output of the evaluating logic circuit 2 to pass through the timing counter only when the timing key 12 is depressed and the flip-flop 20 is not set.

Furthermore, the flip-flop 19 is reset at the instant at which there is set the flip-flop 20. In contrast therewith, flip-flop 20 is reset at the release of the timing key 12.

The key 24 allows for the correction of the counter 14, whose content represents the running time. Upon depression of the keys 8, 12, 24 there is indicated on the display 17 the condition of the counter, associated with the particular key.

Inventively it is possible to have a plurality of timing memory counters with a plurality of timing keys.

In the exemplary circuit schematic illustrated in FIG. 3 of the drawings there is represented only one of a large number of additional circuit possibilities which lie within the scope of the present invention.

Advantageously, the operation of the circuit is assumed by a microprocessor which encompasses the evaluating logic circuit of the pulse generator, all memory counters, the comparator, the frequency standard with the divider steps, as well as the control circuit.

The pulse-time curve illustrated in FIG. 4 of the drawings serves for an illustration of the pulses occuring at the circuit points a–f. The two circular symbols above line a–f clarify the directions of rotation belonging to the pulses which are located therebelow. The pulses of the left side correspond to a rotation of the pulse generator 1 "in a clockwise sense" or "forward", the pulses of the right side of the lines a–f correspond to a rotation of the pulse generator "in a counterclockwise sense" or "backwards". The first two lines a and b illustrate the differing phase position of the pulses which are present at the outputs 3 and $3^1$ of the pulse generator at the forward rotation (left side) and backward rotation of the pulse generator. The voltage which is present at the output 4 of the evaluating logic circuit at the forward rotation and backward rotation of the pulse generator is represented in line c. When the timing key 12 is depressed (pulse in line d) and there appears a coincidence pulse (e) at the output of the comparator 9, then the pulses of the one direction of rotation of the pulse generator are continued to be counted into the timing memory counter (line f, left) even after the appearance of a coincidence pulse; however, in the other direction of rotation the condition of the timing counter 5 remains constant at coincidence with the memory counter 6 (lines e and f, right side).

What is claimed is:

1. In a process for the electronic interruption and cancellation of the interruption of input pulses of a manually rotatable pulse generator to an electronic counter to maintain the count stored therein, comprising the steps of:
   (a) introducing the pulses of the manually rotatable pulse generator into an electronic circuit arrangement;
   (b) detecting the direction of rotation of the pulse generator about its axis from the emitted pulses of the pulse generator, and activating with the emitted pulses the input of an up-down counter in dependence upon the detected direction of rotation;
   (c) comparing the count in said counter with a preset count of a further counter in said circuit arrangement;
   (d) reading the pulses, upon actuation of the ulse generator and of an input switch coacting with the electronic circuit arrangement into said up-down counter until a coincidence is achieved of the count in said up-down counter with the preset count of the other counter, and maintaining the count of the up-down counter to interrupt the further input of pulses from the pulse generator into the up-down counter ; and
   (e) cancelling the interruption of the input pulses into the up-down counter at the coincidence of the count of the up-down counter with the preset count of the further counter, the input switch being opened in the interim.

2. Arrangement as claimed in claim 1, said second storage being controllable by said pulse generator upon actuation of a further input key.

3. Arrangement as claimed in claim 1, said control circuit disrupting the impulse flow from the pulse generator to the first storage only during one direction of rotation of said impulse generator axis at the coincidence of the contents of both said storages.

4. In an arrangement for the electronic interruption and cancellations of the interruption of input pulse 5 of a manually rotatable pulse generator in a first timing memory storage for the purpose of extinguishing one or more storage conditions including an pulse generator; an evaluating logic circuit for the direction of rotation of the pulse generator; a timing memory storage and a second storage; a first comparator influenced by said two storages; a counter; a second comparator influenced by the condition of the counter and the timing memory storage; a frequency generator with a divider in operative connection with said counter; and an alarm emitter, the improvement comprising: a control circuit connected to the output of the first comparator, the control circuit being connected intermediate the pulse output of the evaluating logic circuit recognizing the direction of rotation and the input of the first storage, and which includes an output for the blocking of the alarm emitter.

* * * * *